US009275738B2

(12) United States Patent
Kim et al.

(10) Patent No.: US 9,275,738 B2
(45) Date of Patent: *Mar. 1, 2016

(54) FLASH MEMORY HAVING DUAL SUPPLY OPERATION (71) Applicant: Winbond Electronics Corporation, Tiachung (TW)

(72) Inventors: Jongjun Kim, Cupertino, CA (US); Eungjoon Park, Fremont, CA (US)

(73) Assignee: Winbond Electronics Corporation, Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/697,148

(22) Filed: Apr. 27, 2015

(65) Prior Publication Data

US 2015/0228342 A1   Aug. 13, 2015

Related U.S. Application Data (63) Continuation of application No. 13/875,760, filed on May 2, 2013, now Pat. No. 9,042,172.

(51) Int. Cl.
  *G11C 11/34*  (2006.01)
  *G11C 16/06*  (2006.01)
  *G11C 16/12*  (2006.01)
  (Continued)

(52) U.S. Cl.
  CPC ............... *G11C 16/06* (2013.01); *G11C 16/12* (2013.01); *G11C 16/28* (2013.01); *G11C 29/82* (2013.01)

(58) Field of Classification Search
  USPC .................................................... 365/185.12
  See application file for complete search history.

(56) References Cited

U.S. PATENT DOCUMENTS

| 5,677,868 | A | * | 10/1997 | Takahashi | ............... | G11C 16/16 365/185.29 |
| 5,898,621 | A | * | 4/1999 | Takahashi | ............... | G11C 16/16 365/185.28 |
| 6,230,280 | B1 | * | 5/2001 | Okasaka | ................ | G11C 5/145 713/400 |
| 6,323,699 | B1 | * | 11/2001 | Quiet | .................. | H04L 25/0264 327/108 |

(Continued)

FOREIGN PATENT DOCUMENTS

TW         478250       3/2002
TW        I379516 B1   12/2012

OTHER PUBLICATIONS

Micron Technology, Inc. Parallel NOR Flash Embedded Memory, JS28F256M29EWxx, PC28F256M29EWxx, RC28F256M29EWxx, JS28F512M29EWxx, PC28F512M29EWxx, RC28F512M29EWxx, JS28F00AM29EWxx, PC28F00AM29EWxx, RC28F00AM29EWxx, PC28F00BM29EWxx, RC28F00BM29EWxx, 2012. 75 pages.

(Continued)

*Primary Examiner* — Hoai V Ho
*Assistant Examiner* — Pablo Huerta
(74) *Attorney, Agent, or Firm* — David H. Carroll (57) ABSTRACT A flash memory device may operate from two supply voltages, one being provided externally, and the other being generated within the flash memory device from the external supply voltage. The flash memory device may be provided with a selectable-level buffer for interfacing with either low supply voltage or high supply voltage integrated circuits. To provide even greater flexibility, the flash memory device may be provided with the capability of receiving a second supply voltage from an external source, which may take precedence over the internally-generated second supply voltage or may be combined with the internally-generated second supply voltage.

17 Claims, 5 Drawing Sheets

(51) Int. Cl.
*G11C 16/28* (2006.01)
*G11C 29/00* (2006.01)

(56) References Cited

U.S. PATENT DOCUMENTS

| | | | | |
|---|---|---|---|---|
| 7,558,900 | B2 * | 7/2009 | Jigour | G11C 7/1045 710/105 |
| 8,667,368 | B2 | 3/2014 | Gupta et al. | |
| 9,042,172 | B2 | 5/2015 | Kim et al. | |
| 9,128,822 | B2 | 9/2015 | Michael et al. | |
| 2011/0051520 | A1 * | 3/2011 | Kim | G11C 11/5628 365/185.19 |
| 2013/0297987 | A1 * | 11/2013 | Gupta | G06F 11/1064 714/773 |
| 2014/0269065 | A1 | 9/2014 | Jigour et al. | |

OTHER PUBLICATIONS

Taiwan Intellectual Property Office. Office Action: Taiwan Patent Application No. 102142580, Jul. 16, 2015. 7 Pages.

Winbond Electronics Corporation. W25Q64DW spiflash 1.8V 64M-Bit Serial Flash Memory with Dual/Quad SPI & QPI, Revision C, Jan. 13, 2011. 82 Pages.

Winbond Electronics Corporation. W25Q64DW spiflash 1.8V 64M-Bit Serial Flash Memory with Dual/Quad SPI & QPI, Revision D, Sep. 18, 2012. 82 Pages.

Winbond Electronics Corporation. W25Q128FV spiflash 3V 128M-Bit Serial Flash Memory with Dual/Quad SPI & QPI, Revision D, Oct. 1, 2012. 97 Pages.

Winbond Electronics Corporation. Reply: Taiwan Patent Application No. 102142580, Sep. 8, 2015. 9 Pages.

* cited by examiner

FLASH MEMORY HAVING DUAL SUPPLY OPERATION

CROSS-REFERENCE TO RELATED APPLICATIONS

This application is a continuation of U.S. patent application Ser. No. 13/875,760 filed May 2, 2013, which hereby is incorporated herein in its entirety by reference thereto.

BACKGROUND OF THE INVENTION

1. Field of the Invention

The present invention relates to flash memory, and more particularly to dual supply operation of flash memory.

2. Description of Related Art

Flash memory is used in many different memory device architectures, including various parallel and serial interfaces and various NAND and NOR memory arrays. Some flash memory devices require a high supply voltage of about 3 volts for certain internal operations, but accept either a high supply voltage or a low supply voltage of about 1.8 volts for I/O interface operations. The choice of low or high supply voltage I/O interface operations allows the flash memory device to receive inputs and furnish outputs to other integrated circuits in the system, regardless of whether these other integrated circuits operate at high or low supply voltages.

A common technique among flash memory devices for providing selectable I/O supply voltage operation is to use two supply pins, one for receiving $V_{DD}$ for internal operations, and the other for receiving $V_{DDQ}$ for I/O operations. In this way, 3 volts may be applied to supply pin $V_{DD}$ for powering the internal operations of the flash memory device, while 1.8 volts may be applied to supply pin $V_{DDQ}$ for compatibility with other integrated circuits requiring 1.8 volt I/O operations, or 3 volts may be applied to supply pin $V_{DDQ}$ for compatibility with other integrated circuits requiring 3 volt I/O operations. An example is the flash memory device disclosed in a data sheet by Micron Technology, Inc., Parallel NOR Flash Embedded Memory JS28F256M29EWxx . . . , Rev. B 8/12 EN, 2012, in which the supply pin $V_{CC}$ (equivalent to $V_{DD}$) receives a supply voltage in the range of 2.7V to 3.6V for program, erase and read operations, which the supply pin $V_{CCQ}$ (equivalent to $V_{DDQ}$) receives a supply voltage in the range of 1.65V to 3.6V for the I/O buffers depending on the the I/O operating requirements of the other integrated circuits in the system. In a 56-pin TSOP package the supply pin $V_{CC}$ is pin 43 and the supply pin $V_{DDQ}$ is pin 29, while in a 64-ball fortified BGA package the supply pin $V_{CC}$ is ball G5 and the supply pin $V_{CCQ}$ is ball F1.

BRIEF SUMMARY OF THE INVENTION

One embodiment of the present invention is a flash memory device comprising: a selectable-level buffer having a plurality of active terminals for making electrical connections externally of the flash memory device; a flash memory section; a control section coupled to the flash memory section; a first supply voltage terminal for receiving a first supply voltage from an external voltage source; an internal power bus coupled to the first supply voltage terminal; and a supply voltage generator coupled to the internal power bus for generating an internal voltage from the first supply voltage, and for furnishing the internal voltage as a second supply voltage from an output thereof; the selectable-level buffer being coupled to the internal power bus and to the output of the supply voltage generator for selectively operating the active terminals at the first supply voltage or the second supply voltage.

Another embodiment of the present invention is a packaged SPI-NAND flash memory device comprising: an eight pin package comprising active pins DI/IO0, DO/IO1, WPb/IO2, HOLDb/IO3, CLK, and CSb, a VDD pin, and a GND pin in compliance with a SPI protocol; an internal supply voltage generator coupled to the VDD pin for receiving an external supply voltage VDD and generating an internal supply voltage INTVDD from the external supply voltage VDD; a selectable-level buffer coupled to the active pins, and further being coupled to the VDD pin and to the internal supply voltage generator for selectively operating the active pins at the external supply voltage VDD or at the internal supply voltage INTVDD; a NAND flash memory array; a page buffer coupled to the NAND flash memory array; an input/output control circuit coupled to the selectable-level buffer and to the page buffer for controlling data flow between the selectable-level buffer and the page buffer; and control logic coupled to the selectable-level buffer, the input/output control circuit, the page buffer, and the flash memory array for controlling memory read, program and erase operations of the NAND flash memory array in accordance with commands received via the selectable-level buffer.

Another embodiment of the present invention is method of configuring a flash memory device having high supply voltage core circuits for low supply voltage input/output operations, comprising: receiving a high supply voltage at the flash memory device; generating a low supply voltage on the flash memory device from the high supply voltage; applying the high supply voltage and the low supply voltage to a buffer circuit on the flash memory device, the buffer circuit having a plurality of active terminals for making electrical connections externally of the flash memory device; and operating the active terminals at the low supply voltage.

DETAILED DESCRIPTION OF THE INVENTION, INCLUDING THE BEST MODE

Serial peripheral interface NOR ("SPI-NOR") flash memory devices are available with the SPI 4-to-6 active pin SPI interface and in small space-efficient packages; see, e.g., Winbond Electronics Corporation, W25Q128FV SpiFlash 3V 128M-Bit Serial Flash Memory with Dual/Quad SPI & QPI, Revision D, Oct. 1, 2012, which hereby is incorporated herein in its entirety by reference thereto. Suitable small space-efficient package types include 8-pin SOIC 208-mil, 8-pin VSOP 208-mil, 8-pin PDIP 300-mil, 8-pad WSON 6×5-mm, 8-pad WSON 8×6-mm, 16-pin SOIC 300-mil, and 24-ball TFBGA 8×6-mm. The SPI-NAND flash memory is a new emerging product line, which offers higher density at lower per-bit cost with the same low pin-count SPI interfaces and in the same small space-efficient packages as SPI-NOR flash memory.

The SPI interface includes single-bit and multi-bit options. Single-bit SPI uses four active pins for transferring commands, address and data to, and data from, the serial flash memory, namely: Chip Select (/CS), Clock (CLK), Data In (DI) and Data Out (DO). Multi-bit SPI which includes Dual SPI, Quad SPI and Quad Peripheral Interface ("QPI") use the same four pins but reconfigurable to transfer more serial data per clock cycle. Dual SPI changes the DI and DO pins to bi-directional DIO (Input/Output) pins. Quad SPI also changes the DI and DO pins to DIO pins, and adds two additional DIO pins for a total of four DIO pins, and for a total of six active pins when /CS and CLK are considered. QPI has four DIO pins like Quad SPI, but allows for full quad (four DIO) operation even for initial commands. The Quad SPI interface and the Quad Peripheral Interface in particular offer high thru-put performance, which is advantageous for certain applications. The SPI interface is described in further detail in, for example, U.S. Pat. No. 7,558,900 issued Jul. 7, 2009 to Jigour et al., which hereby is incorporated herein in its entirety by reference thereto.

Some flash memory devices may have core circuits which operate internally at a nominal 3 volts, but one may desire to use such flash memory devices in applications which incorporate other integrated circuits operating at a different supply voltage, such as a nominal 1.8 volts. Although such applications may offer dual supplies, some flash memory devices are packaged such that not one additional pin is available for receiving a second supply voltage. Even if the flash memory device has an additional pin for receiving a second supply voltage, the flash memory device may be mounted on a printed circuit board which only has a high supply voltage trace (nominally 3 volts) for supplying the flash memory device.

One may desire, for example, to use high-density SPI-NAND flash memory in a high-performance, dual supply application. The Quad SPI and QPI modes of the SPI-NAND flash memory are particularly suitable for such high performance applications, and the SPI-NAND flash memory may be designed to operate at high clock rates. However, in such applications, the active inputs of the SPI-NAND device in quad mode, namely /CS, CLK, and the four data inputs thru I/O, may be driven by another integrated circuit operating at $V_{DD}$=1.8V nominal, while the four data outputs thru I/O may be supplied to another integrated circuit operating at $V_{DD}$=1.8V nominal.

Figure 2:
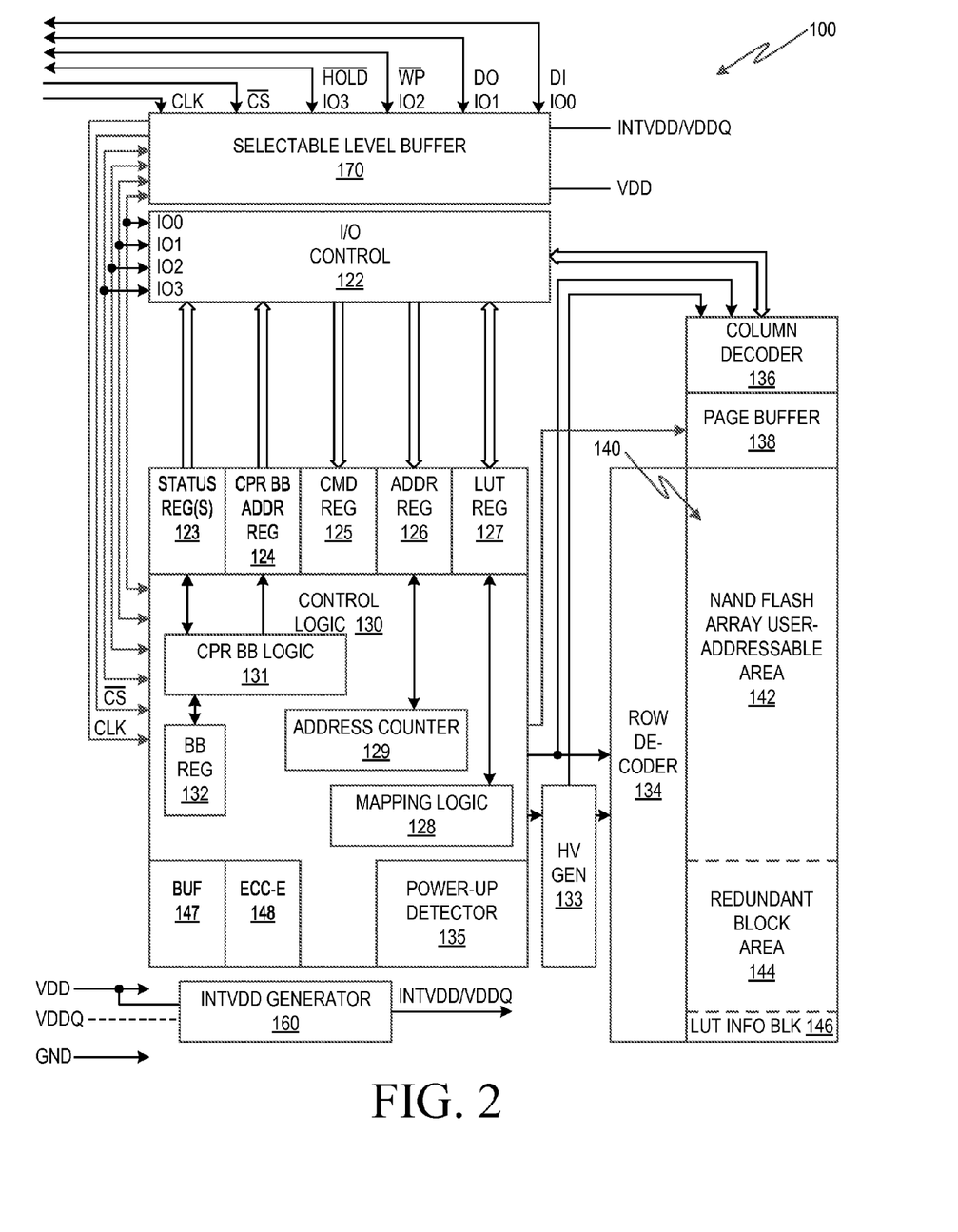
FIG. 2 is a functional block schematic diagram of a SPI-NAND flash memory device.

The input and output buffers, therefore, may be designed to operate at 1.8V nominal to provide this compatibility. However, such a high performance SPI-NAND flash memory may have various core internal circuits which are designed to operate at 3V nominal. In some SPI-NAND flash memory designs, for example, the high supply voltage source VDD may vary over a range of, for example, 2.5V to 3.6V, and may be applied directly to some core circuits which are tolerant of such variation, and may be applied through a voltage regulator of, for example, 2.4V to other core circuits which operate best with a stable supply voltage, such as the page buffer 138, a charge pump in the high voltage generator 133, and the control logic 130. Therefore, such a SPI-NAND flash memory device needs to operate at two different supply voltages, a high supply voltage and a low supply voltage. However, when confined to an 8-pin package such as a 8-pin WSON and 8-pin SOIC packages, the six active pins and the VDD and GND pins of the SPI interface preempt all pins of the package, leaving none available for connection to a second supply voltage VDDQ. Even if a larger package with available pins is used, the printed circuit board on which the SPI-NAND flash memory device is mounted may not have a second supply trace for providing a second supply voltage to the SPI-NAND flash memory device.

Advantageously, a flash memory device may operate from two supply voltages, one being external and distributed throughout the flash memory device in regulated or unregulated form by a suitable internal power bus or busses, and the other being generated within the flash memory device from the external supply voltage. To provide additional flexibility, the flash memory device may be provided with a selectable-level buffer for interfacing with either low supply voltage or high supply voltage integrated circuits. To provide even greater flexibility, the flash memory device may be provided with the capability of receiving a second supply voltage from an external source, which may take precedence over the internally-generated second supply voltage or may be combined with the internally-generated second supply voltage in any desired manner.

While the techniques described herein are especially advantageous for enabling dual supply operation of a SPI-NAND flash memory device implemented in an 8-pin package such as a 8-pin WSON or 8-pin SOIC package, they may be used to enable dual supply operation of any flash memory device, with or without an additional supply voltage pin, and regardless of the type of flash memory array, the type of interface, and the number of pins.

Figure 1:
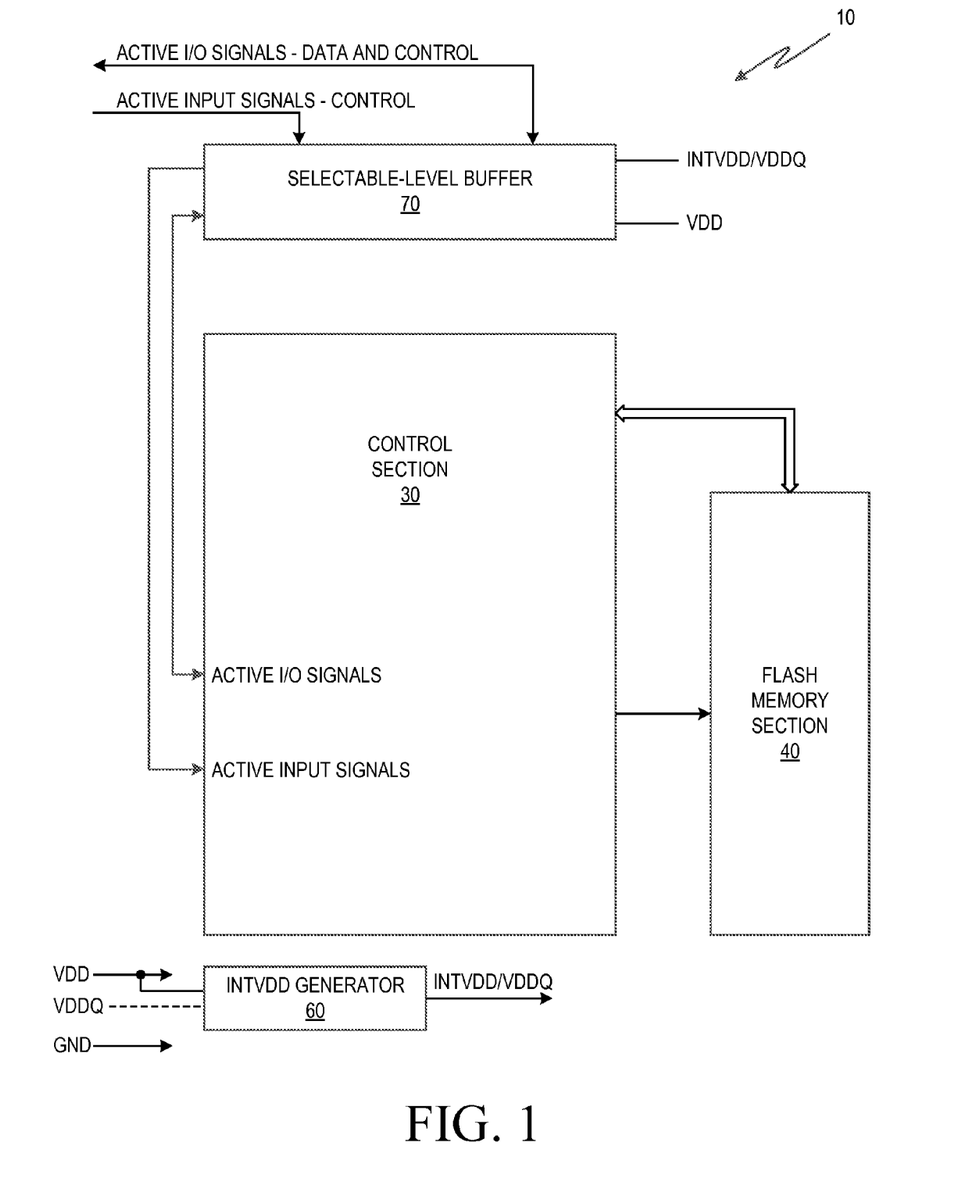
FIG. 1 is a high-level functional block schematic diagram of a flash memory device.

FIG. 1 is a high-level functional block schematic diagram of a flash memory device 10 which includes a flash memory section 40 and a control section 30. Data is communicated between the flash memory section 40 and the control section 30 over suitable data lines, the communications being controlled by control signals from the control section 30 to the flash memory section 40. The flash memory device 10 may operate from two supply voltages, the supply voltage VDD being received from an external supply, and the supply voltage INTVDD being a lower level supply voltage generated from VDD by an INTVDD generator 60 internal to the flash memory device 10. VDD may be furnished to various circuits in the memory device 10 as provided, or may be regulated for other circuits requiring a stable voltage level. Various active input/output signals, which generally are data (including command, address and data to or from memory) and control signals, and various active input signals, which generally are control signals, are communicated between the control section 30 of the flash memory device 10 and external integrated circuits via a selectable-level buffer 70 and various suitable terminals (not shown), generally pins, pads or balls of a package or pads of an integrated circuit. The precise signals are specified by the particular protocol for the desired interface, and the selectable-level buffer 70 enables interfacing with either low supply voltage or high supply voltage integrated circuits. To provide even greater flexibility, the flash memory device may be provided with the capability of receiving a second supply voltage VDDQ from an external source, which may take precedence over the internally-generated second supply voltage INTVDD or may be combined with the the internally-generated second supply voltage in any desired manner.

FIG. 2 is a schematic functional block diagram of an illustrative SPI-NAND memory 100. The SPI-NAND flash memory 100 includes a NAND flash array 140 and associated page buffer 138. The NAND flash array 140 includes word (row) lines and bit (column) lines, and is organized into a user-addressable area 142, a redundant block area 144, and a LUT information block 146. Any desired flash memory cell technology may be used for the flash memory cells of the NAND flash array 140. The SPI-NAND flash memory 100 may include various other circuits to support memory programming, erase and read, such as row decoder 134, column decoder 136, I/O control 122, status register(s) 123, continuous page read ("CPR") address register(s) 124, command register 125, address register 126, a LUT register 127, control logic 130, CPR bad block logic 131, a CPR bad block register 132, and high voltage generators 133. The row decoder 134 selects rows of the user-addressable area 142 under user control as well as, in some implementations, under internal control; and selects rows of the redundant block area 144 and LUT information block 146 under internal control. A buffer mode flag BUF 147 may be provided for mode switching. A power-up detector 135 is provided in the control logic 130 to initiate the setting of a particular mode and the loading of a default page upon power-up. Power is supplied (not shown) throughout the circuits of the SPI-NAND flash memory 100 by supply lines VDD and GND. While the NAND flash memory 100 may be packaged in any desired manner and may have any type of interface, including ordinary NAND flash memory interfaces, the control logic 130 of FIG. 2 illustratively implements the SPI protocol, including multi-IO SPI and QPI. The standard SPI flash control signals /CS, CLK, DI and DO, and optional signals /WP and /HOLD are shown, along with additional data bus signals for Dual SPI and Quad SPI operation, i.e. I/O(0), I/O(1), I/O(2), and I/O (3), achieved by selectively redefining the function of four pins. Additional detail on the SPI/QPI interface and on the various circuits of the memory may be found in U.S. Pat. No. 7,558,900 issued Jul. 7, 2009 to Jigour et al., and in a publication by Winbond Electronics Corporation, W25Q64DW: SpiFlash 1.8V 64M-Bit Serial Flash Memory with Dual/Quad SPI & QPI: Preliminary Revision C, Hsinchu, Taiwan, R.O.C., Jan. 13, 2011, which hereby are incorporated herein in their entirety by reference thereto. Additional detail on the illustrative SPI-NAND memory 100 may be found in U.S. patent application Ser. No. 13/799,215 filed Mar. 13, 2013 (Jigour et al., NAND Flash Memory), which hereby is incorporated herein in its entirety by reference thereto.

The page buffer 138 may be suitably organized and operated to eliminate gaps and discontinuities in the output data during a continuous page read. An ECC circuit (not show) may be provided to perform ECC computations on the contents of the cache register depending on the status of an ECC-E flag 148. Additional detail on the page buffer 138, the ECC circuit, and their operations may be found in U.S. patent application Ser. No. 13/464,535 filed May 4, 2012 (Gupta et al., Method and Apparatus for Reading NAND Flash Memory), which hereby is incorporated herein in its entirety by reference thereto. Because of the generally poor reliably of NAND memory cells, bad block management may be employed. Bad block management is described in greater detail in U.S. patent application Ser. No. 13/530,518 filed Jun. 22, 2012 (Michael et al., On-Chip Bad Block Management for NAND Flash Memory), which hereby is incorporated herein in its entirety by reference thereto.

To enable the SPI-NAND flash memory 100 to operate with two supply voltages without requiring a dedicated pin for the second supply voltage, the SPI-NAND flash memory 100 includes an INTVDD generator 160. The INTVDD generator 160 generates second supply voltage INTVDD from the externally-applied VDD supply voltage. To provide the flexibility of operating the SPI-NAND flash memory 100 in conjunction with either low supply voltage (1.8V nominal) or high supply voltage (3V nominal) integrated circuits, the SPI-NAND flash memory 100 includes a selectable-level buffer 170, which sets the I/O level of the SPI-NAND flash memory 100 to interface with either low supply voltage or high supply voltage integrated circuits, as desired. If an additional pin is available to receive the second supply voltage from an external source, the INTVDD generator 160 may be connected to the pin for controlling whether the external second supply voltage, the internally generated second supply voltage, or some combination of the two is used as the internal second supply voltage.

Figure 3:
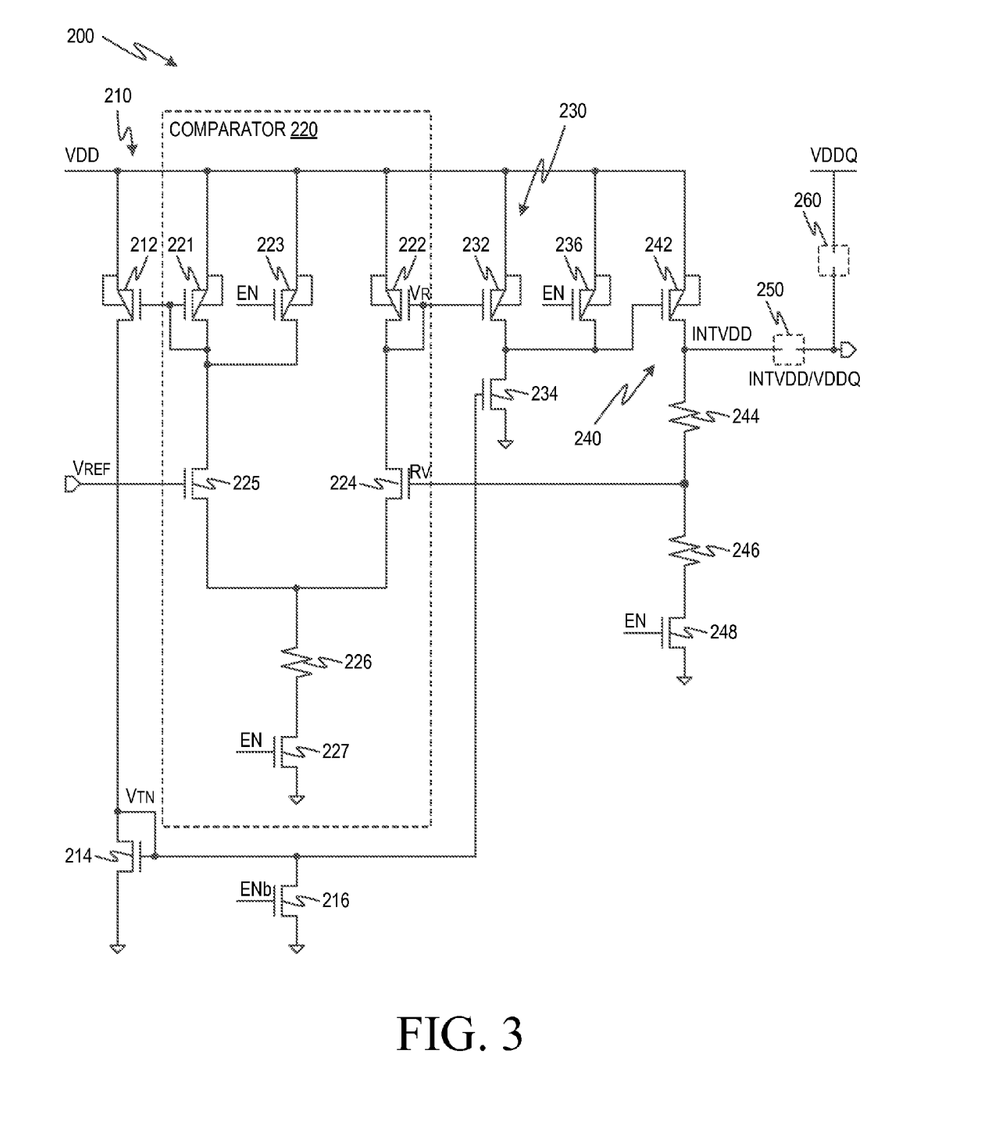
FIG. 3 is a circuit schematic diagram of an illustrative INTVDD generator suitable for the SPI-NAND flash memory device of FIG. 2.

FIG. 3 is a circuit schematic diagram of an illustrative INTVDD generator 200, which is suitable for use as the INTVDD generator 160 of FIG. 2. A comparator 220 receives a reference voltage VREF, which may be generated in any suitable manner, such as, for example, with an internal band gap reference. The reference voltage VREF is applied to the gate of n-channel MOSFET 225 in the left branch, which also includes p-channel MOSFET 221 which has its gate tied to its drain. The right branch includes a n-channel MOSFET 224, which has its gate connected to a voltage divider formed by resistors 244 and 246. The resistors 244 and 246 may be provide with a trim option such as NAND fuses, for example, for fine-tuning the internal supply voltage INTVDD. The right branch also includes p-channel MOSFET 222, which has its gate tied to its drain. A resistor 226 is connected in common with both branches, and is operationally connected to ground through n-channel MOSFET 227. The output $V_R$ of the comparator 220 is furnished to the gate of p-channel MOSFET 232 in driver circuit 230. The driver circuit 230 also includes n-channel MOSFET 234 in series with the p-channel MOSFET 232. The gate of n-channel MOSFET 234 is furnished with a bias voltage from a bias voltage circuit 210, which includes p-channel MOSFET 212 in series with n-channel MOSFET 214. The gate of MOSFET 212 is connected to the gate of MOSFET 221 in the comparator 220, while the gate of MOSFET 214 is connected to its drain and also to the gate of MOSFET 234. The output of the driver 230 is the junction between the drain of the MOSFET 232 and the drain of the MOSFET 234, which is connected to the gate of p-channel MOSFET 242 in the source follower circuit 240. The MOSFET 242 may be made a rather large transistor to sustain high switching currents. The resistive load for the source follower is the voltage divider formed by resistors 244 and 246. The output of the source follower 240 is INTVDD, which is supplied through a connector 250 in the metallization layer to an output INTVDD/VDDQ. An external second supply voltage VDDQ is supplied through a connector 260 in the metallization layer to an output INTVDD/VDDQ.

The INTVDD generator 200 may also be provided with the capability of receiving an external second supply VDDQ from an available pin and providing that second supply voltage as the output voltage. The choice between the internally generated INTVDD and the externally supplied VDDQ may be made in any desired manner. As shown in FIG. 3, either INTVDD or VDDQ may be selected based on the selected metal option 250 or 260. Alternatively, the choice between INTVDD or VDDQ may be made by an internal register setting. Alternatively, a circuit may be provided to automatically select the higher voltage, or to select VDDQ when present in preference to INTVDD, or to generate a voltage as a function of the two voltages such as the average of the two voltages, or to implement any other desired criteria.

An enable signal EN may be supplied to the INTVDD generator 200 and asserted to enable its operation when the flash memory device is used with other integrated circuits operating at a different supply voltage, such as a nominal 1.8 volts, and otherwise may be de-asserted. Alternatively, the enable signal EN may be continuously asserted so that the INTVDD generator 200 is continuously in operation, or the INTVDD generator may be designed without enabling circuits so to remain continuously in operation. Assertion of the enable signal EN opens the n-channel MOSFET 216 in the bias circuit 210, the p-channel MOSFET 223 in the comparator 220, and the p-channel MOSFET 236 in the driver 230, thereby enabling these circuits to function. The n-channel MOSFET 248 in the emitter follower 240 is closed, thereby allowing the emitter follower 240 and the voltage divider formed by resistors 244 and 246 to function. The level of the internal supply voltage INTVDD is determined by the ratio of the resistors 244 and 246. As INTVDD deviates from its specified value, the comparator 220 acts to correct the deviation. If INTVDD becomes lower than the design potential (illustratively 1.8 volts, for example), the voltage $R_V$ decreases so that the voltage $V_R$ increases. Increasing $V_R$ causes the output of the driver 230 to decrease, so that the emitter follower 240 increases its output voltage INTVDD, which in turn raises $R_V$ until equilibrium is achieved. On the other hand, if INTVDD becomes higher than the design potential, the voltage $R_V$ increases so that the voltage $V_R$ decreases. Decreasing $V_R$ causes the output of the driver 230 to increase, so that the emitter follower 240 decreases its output voltage INTVDD, which in turn lowers $R_V$ until equilibrium is achieved.

Figure 4:
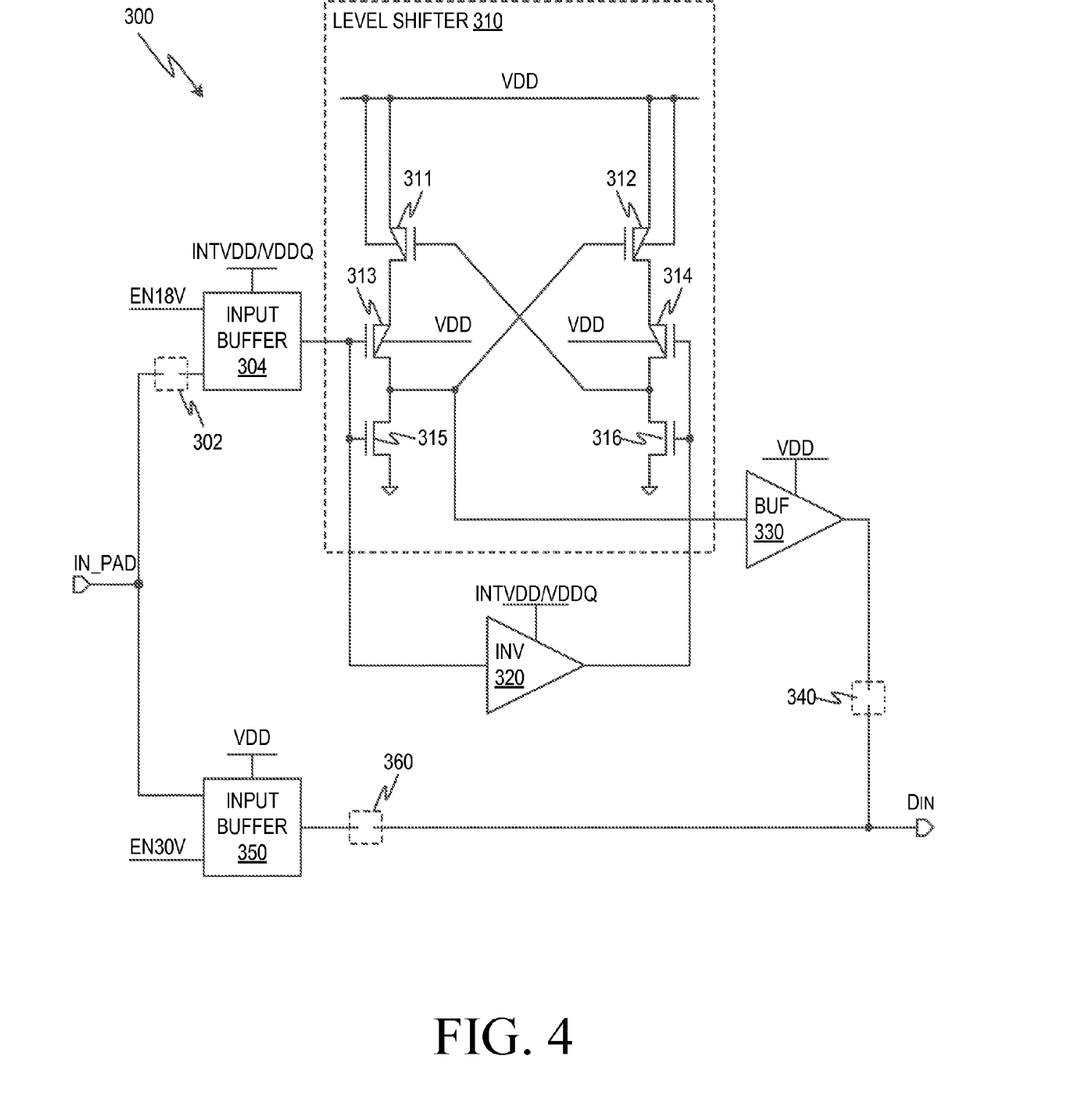
FIG. 4 is a circuit schematic diagram of an illustrative input buffer suitable for the SPI-NAND flash memory device of FIG. 2.

FIG. 4 is a circuit schematic diagram of an illustrative input buffer 300, which is suitable for use in the selectable-level buffer 170 of FIG. 2. When the application uses a single high supply voltage (3V nominal) supply, an input buffer 350 powered by VDD is selected in any suitable manner, such as, for example, by high supply voltage selection bit EN30V. The input buffer 350 may be implemented in any suitable manner, such as, for example, with two CMOS inverters. The output of the buffer 350 is provided as the output DIN of the input buffer through a metal option 360. In this configuration, the input of an input buffer 304 may optionally be tied to GND by a metal option (not shown). However, when the input is provided by an integrated circuit operating at low supply voltage (1.8V nominal), the input buffer 304 powered by INTVDD/VDDQ is selected in any suitable manner, such as, for example, by low supply voltage selection bit EN18V. In this configuration, the input of the input buffer 304 may be connected to IN_PAD by metal option 302. The input buffer 304 may be implemented in any suitable manner, such as, for example, with two CMOS inverters. The 1.8V output of the buffer 304 is provided to a level shifter 310, which has a left branch formed by p-channel MOSFETs 311 and 313 a n-channel MOSFET 315, and a right branch formed by p-channel MOSFETs 312 and 314 a n-channel MOSFET 316. The left and right branches are cross-coupled. The high voltage output of the level shifter 310, which is provided by the drains of MOSFETs 313 and 315, is supplied to a buffer 330 powered by VDD, and the output of the buffer 330 is provided as the output DIN of the input buffer through a metal option 340.

In dual supply operation, the output of the input buffer 304 is furnished to the gate of MOSFET 313 in the left branch, and the inverse is furnished to the gate of MOSFET 314 in the right branch through inverter 320, which is powered by INTVDD/VDDQ. When the output of the input buffer 304 is 1.8V nominal, the MOSFET 315 is "on" and the MOSFET 311 is "off" so that the level shifter 310 in effect latches ground potential, which is supplied to the buffer 330. However, when the output of the input buffer 304 is about 0V, the MOSFET 315 is "off" and the MOSFETs 311 and 313 are "on" so that the level shifter 310 in effect latches VDD (about 3V nominal) which is supplied to the buffer 330.

Figure 5:
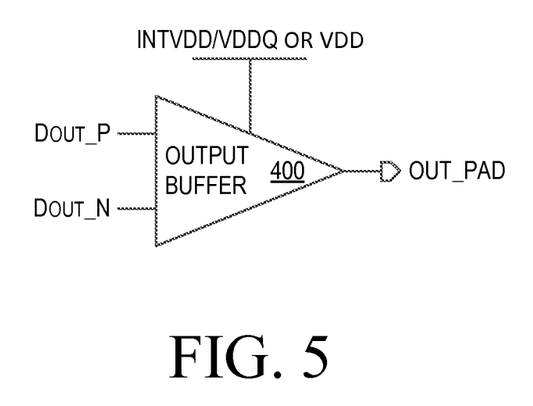
FIG. 5 is a circuit schematic diagram of an illustrative output buffer suitable for the SPI-NAND flash memory device of FIG. 2.

FIG. 5 is a circuit schematic diagram of an illustrative output buffer 400, which is suitable for use in the selectable-level buffer 170 of FIG. 2. The output buffer 400 may be powered from INTVDD or VDDQ for dual supply operation, or powered from VDD for single supply operation. The selection may be implemented by metal options. Signals DOUT_P and DOUT_N are driven from a previous stage of inverter(s). While DOUT_P and DOUT_N have the same polarity, they may be separate signals in some designs for purpose of output ramp rate control to minimize VDD and/or GND bounce.

Figure 6:
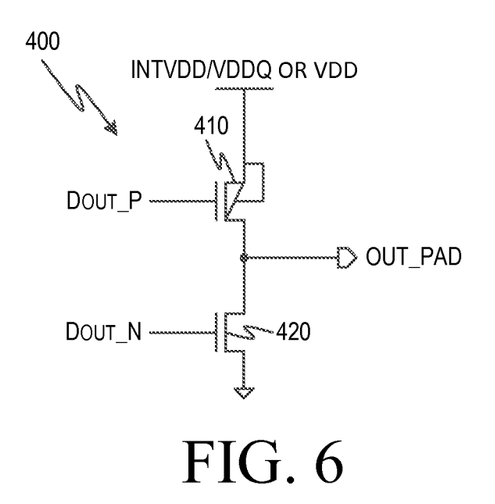
FIG. 6 is a circuit schematic diagram of an illustrative implementation of the output buffer of FIG. 5.

FIG. 6 is a circuit schematic diagram of an illustrative implementation of the output buffer of FIG. 5. The output buffer is formed with a series connection of a p-channel MOSFET 410 and a n-channel MOSFET 420. The data signal DOUT_P is supplied to the gate of the MOSFET 410, and the inverted data DOUT_N is supplied to the gate of the MOSFET 420. The output OUT_PAD is taken from the interconnected drains of the MOSFETs 410 and 420. The data signal DOUT_P may be 0V or 3V nominal, while the voltage on the source of the MOSFET 410 may be 3V nominal or 1.8V nominal. Although DOUT_P may be higher than INTVDD or VDDQ, the MOSFET 410 is nonetheless effectively turned off so that the difference in magnitude is not adverse to proper operation.

While the various examples described herein use metal options to make certain selections, these selections may alternatively be made using option bits, status register bits, tri-state buffers, or other convenient techniques. Choosing between VDD, INTVDD, and VDDQ for the selectable-level buffer 170 (FIG. 2), for example, may be made by an option bit or status register bit. The choice between the buffer 330 and the buffer 350, for example, may be achieved by using tri-state buffers controlled by NAND fuse option bits, for example.

The description of the invention including its applications and advantages as set forth herein is illustrative and is not intended to limit the scope of the invention, which is set forth in the claims. Variations and modifications of the embodiments disclosed herein are possible, and practical alternatives to and equivalents of the various elements of the embodiments would be understood to those of ordinary skill in the art upon study of this patent document. For example, although the main implementation described is for SPI-NAND flash memory, the techniques described herein are generally applicable to all types of flash memory. Moreover, specific values given herein are illustrative, and may be varied as desired. While the circuits are specifically described with PMOS and NMOS transistors, the type of MOSFET (p-channel or n-channel) may be changed in some instances. Although a load in the form of resistors and trimming fuses is described, other types of loads may be used instead. These and other variations and modifications of the embodiments disclosed herein, including of the alternatives and equivalents of the various elements of the embodiments, may be made without departing from the scope and spirit of the invention, including the invention as set forth in the following claims.

The invention claimed is:

1. A flash memory device operable at a first supply voltage while supporting Input/Output ("I/O") interface operations with external circuits operable at either the first supply voltage or at a second supply voltage less than the first supply voltage, comprising:

a plurality of active terminals;
a flash memory section;
a control section coupled to the flash memory section;
a selectable-I/O level buffer coupled to the control section and to the active terminals to communicate control and data signals externally of the flash memory device;
a first supply voltage terminal for receiving a first supply voltage from an external voltage source;
an internal power bus coupled to the first supply voltage terminal; and
a supply voltage generator coupled to the internal power bus for generating an internal voltage less than the first supply voltage from the first supply voltage, and for furnishing from the internal voltage at an output thereof an output voltage at a level adapted to interface with external circuits operable at the second supply voltage;
the selectable-I/O level buffer being coupled to the internal power bus and to the output of the supply voltage generator for selectively operating the active terminals at the first supply voltage or the output voltage.

2. The flash memory device of claim 1 further comprising:
a second supply voltage terminal for receiving a third supply voltage from an external voltage source;
the supply voltage generator further being coupled to the second supply voltage terminal for furnishing the output voltage from the internal voltage either in lieu of or in combination with the third supply voltage.

3. The flash memory device of claim 2 wherein the supply voltage generator comprises a voltage selection circuit for selecting the internal voltage and in lieu of the third supply voltage.

4. The flash memory device of claim 2 wherein the supply voltage generator comprises a voltage processing circuit for generating the output voltage as a function of the internal voltage and the third supply voltage.

5. The flash memory device of claim 1 further comprising an 8-pin SOIC 208-mil package, an 8-pin VSOP 208-mil package, an 8-pin PDIP 300-mil package, an 8-pad WSON 6×5-mm package, or an 8-pad WSON 8×6-mm package, the selectable-I/O level buffer, the flash memory section, the control section, the internal power bus, and the supply voltage generator being contained therein.

6. The flash memory device of claim 1 further comprising a 16-pin SOIC 300-mil package or a 24-ball TFBGA 8×6-mm package, the selectable-I/O level buffer, the flash memory section, the control section, the internal power bus, and the supply voltage generator being contained therein.

7. The flash memory device of claim 1 wherein the flash memory section comprises a NAND flash memory array.

8. The flash memory device of claim 1 wherein the flash memory section comprises a NOR flash memory array.

9. The flash memory device of claim 1 further comprising a ground terminal, wherein the plurality of active terminals, the first supply voltage terminal, and the ground terminal are compliant with an 8-terminal SPI protocol.

10. The flash memory device of claim 1 further comprising a ground terminal, wherein the plurality of active terminals, the first supply voltage terminal, and the ground terminal are compliant with a parallel interface protocol.

11. The flash memory device of claim 1 wherein the internal power bus is adapted to carry the first supply voltage without internal voltage regulation.

12. The flash memory device of claim 1 wherein the internal power bus is adapted to carry the first supply voltage with internal voltage regulation.

13. The flash memory device of claim 1 wherein the selectable-I/O level buffer comprises an input buffer section and an output buffer section.

14. The flash memory device of claim 13 wherein the input buffer section comprises:
an input buffer input node;
a first selectable buffer circuit operable at the first supply voltage and having an input coupled to the input buffer input node and an output;
a second selectable buffer circuit operable at the internal voltage and having an input coupled to the input buffer input node and an output;
a level shifter having an input coupled to the output of the second buffer circuit and an output, and configured to furnish a signal at the output thereof having a level at the first supply voltage when a signal having a level at the internal voltage is present at the input thereof; and
an input buffer output node coupled to the output of the first buffer circuit and to the output of the level shifter.

15. The flash memory device of claim 13 wherein the output buffer section comprises:
an output buffer input node;
a buffer circuit selectively operable at the first supply voltage or the internal voltage, and having an input coupled to the output buffer input node and an output; and
an output buffer output coupled to the output of the buffer circuit.

16. The flash memory device of claim 13 wherein the selectable-I/O level buffer comprises:
an input buffer input node;
a first selectable buffer circuit operable at the first supply voltage and having an input coupled to the input buffer input node and an output;
a second selectable buffer circuit operable at the internal voltage and having an input coupled to the input buffer input node and an output;
a level shifter having an input coupled to the output of the second buffer circuit and an output, and configured to furnish a signal at the output thereof having a level at the first supply voltage when a signal having a level at the internal voltage is present at the input thereof;
an input buffer output node coupled to the output of the first buffer circuit and to the output of the level shifter;
an output buffer input node;
a third buffer circuit selectively operable at the first supply voltage or the internal voltage, and having an input coupled to the output buffer input node and an output; and
an output buffer output coupled to the output of the third buffer circuit.

17. A method of operating a flash memory device operable at a high supply voltage and comprising a plurality of active terminals for making electrical connections externally of the flash memory device to support Input/Output ("I/O") interface operations with external circuits operable at either the high supply voltage or at a low supply voltage, and a plurality of high supply voltage core circuits including a flash memory section and a control section coupled to the flash memory section, comprising:
receiving the high supply voltage at the flash memory device;
generating an internal voltage on the flash memory device from the high supply voltage, the internal voltage being less than the high supply voltage and at a level adapted to interface with external circuits operable at the low supply voltage;

applying the high supply voltage and the internal voltage to a selectable-I/O level buffer circuit on the flash memory device, the selectable-I/O level buffer circuit being coupled to the control section and to the active terminals to communicate control and data signals externally of the flash memory device; and operating the active terminals at the internal voltage.

* * * * *